United States Patent
King et al.

(10) Patent No.: US 11,006,546 B2
(45) Date of Patent: May 11, 2021

(54) EQUIPMENT ENCLOSURE FAN CONTROL SYSTEMS AND METHODS

(71) Applicant: Eaton Intelligent Power Limited, Dublin (IE)

(72) Inventors: Gary Bradley King, Raleigh, NC (US); Edin Vajzovic, Durham, NC (US); Justin Raymond Hogland, Wake Forest, NC (US); David Zheng, Shenzhen (CN)

(73) Assignee: Eaton Intelligent Power Limited

( * ) Notice: Subject to any disclaimer, the term of this patent is extended or adjusted under 35 U.S.C. 154(b) by 498 days.

(21) Appl. No.: 14/646,855

(22) PCT Filed: Nov. 28, 2012

(86) PCT No.: PCT/CN2012/085468
§ 371 (c)(1),
(2) Date: May 22, 2015

(87) PCT Pub. No.: WO2014/082229
PCT Pub. Date: Jun. 5, 2014

(65) Prior Publication Data
US 2015/0305197 A1    Oct. 22, 2015

(51) Int. Cl.
*H05K 7/20* (2006.01)

(52) U.S. Cl.
CPC ......... *H05K 7/20209* (2013.01); *H05K 7/207* (2013.01); *H05K 7/20136* (2013.01); *H05K 7/20909* (2013.01)

(58) Field of Classification Search
CPC .............. H05K 7/20209; H05K 7/207; H05K 7/20136; H05K 7/20909
See application file for complete search history.

(56) References Cited

U.S. PATENT DOCUMENTS

| 4,903,685 A | 2/1990 | Melink |
| 5,934,368 A * | 8/1999 | Tanaka ................. F24F 11/0008 165/231 |

(Continued)

FOREIGN PATENT DOCUMENTS

| CN | 1485543 A | 3/2004 |
| CN | 2645410 Y | 9/2004 |

(Continued)

OTHER PUBLICATIONS

Chinese First Office Action Corresponding to Application No. 201280077143.1; dated Aug. 24, 2016; Foreign Text, 10 Pages.

(Continued)

*Primary Examiner* — Kun Kai Ma
(74) *Attorney, Agent, or Firm* — Stanek Lemon Crouse & Meeks, P.A.

(57) ABSTRACT

An uninterruptible power supply (UPS) system includes an enclosure and a plurality of power converter modules positioned in the enclosure, each power conversion module including a power converter circuit, a module controller circuit configured to control the power converter circuit and at least one module fan controlled by the module controller circuit. The system further includes a system controller positioned in the enclosure and configured to communicate with the module controller circuits over a communications bus and at least one exhaust fan configured to exhaust air from the enclosure and controlled by the system controller. The system controller is configured to control the at least one exhaust fan responsive to information, such as temperature and/or load information, received from the module controller circuits.

11 Claims, 4 Drawing Sheets

(56) References Cited

U.S. PATENT DOCUMENTS

| | | | |
|---|---|---|---|
| 6,026,891 A | 2/2000 | Fujiyoshi et al. | |
| 6,037,732 A | 3/2000 | Alfano et al. | |
| 6,104,003 A * | 8/2000 | Jones | F26B 21/06 |
| | | | 165/104.33 |
| 6,142,866 A * | 11/2000 | Wright | H05K 7/20209 |
| | | | 165/122 |
| 6,324,608 B1 * | 11/2001 | Papa | H05K 7/1492 |
| | | | 710/104 |
| 6,398,505 B1 * | 6/2002 | Sekiguchi | F04D 25/166 |
| | | | 361/695 |
| 6,428,282 B1 * | 8/2002 | Langley | F04D 27/004 |
| | | | 417/2 |
| 6,463,891 B2 | 10/2002 | Algrain et al. | |
| 7,010,392 B2 * | 3/2006 | Bash | F24F 11/0009 |
| | | | 62/177 |
| 7,331,532 B2 | 2/2008 | Currie et al. | |
| 7,414,835 B2 * | 8/2008 | Katakura | G11B 33/125 |
| | | | 361/679.33 |
| 7,589,436 B2 * | 9/2009 | Takahashi | G06F 1/30 |
| | | | 307/112 |
| 7,714,731 B2 * | 5/2010 | Palaszewski | H05K 7/207 |
| | | | 340/584 |
| 8,237,386 B2 | 8/2012 | Culbert et al. | |
| 8,270,154 B2 | 9/2012 | Andersen et al. | |
| 9,820,411 B2 * | 11/2017 | Alshinnawi | H05K 7/207 |
| 9,894,015 B2 * | 2/2018 | Baba | H05K 7/207 |
| 9,901,007 B1 * | 2/2018 | Reynov | H05K 7/20309 |
| 9,930,814 B2 * | 3/2018 | Endo | G05B 15/02 |
| 2002/0149911 A1 | 10/2002 | Bishop et al. | |
| 2003/0112600 A1 * | 6/2003 | Olarig | H05K 7/20581 |
| | | | 361/679.48 |
| 2003/0147216 A1 * | 8/2003 | Patel | H05K 7/20754 |
| | | | 361/700 |
| 2004/0130868 A1 * | 7/2004 | Schwartz | G06F 1/20 |
| | | | 361/679.48 |
| 2004/0150374 A1 * | 8/2004 | Kraus | H02J 9/066 |
| | | | 322/4 |
| 2005/0077065 A1 * | 4/2005 | Kleinecke | H05K 7/207 |
| | | | 174/17 VA |
| 2006/0006246 A1 | 1/2006 | Kim | |
| 2006/0016901 A1 * | 1/2006 | Beitelmal | H05K 7/20209 |
| | | | 236/49.3 |
| 2006/0039108 A1 * | 2/2006 | Chikusa | G06F 1/20 |
| | | | 361/695 |
| 2006/0092609 A1 * | 5/2006 | Mandel | H05K 7/207 |
| | | | 361/695 |
| 2006/0259622 A1 * | 11/2006 | Moore | G06F 9/505 |
| | | | 709/226 |
| 2006/0259793 A1 * | 11/2006 | Moore | G06F 1/206 |
| | | | 713/300 |
| 2007/0047212 A1 * | 3/2007 | Fendley | H05K 7/20218 |
| | | | 361/724 |
| 2008/0192431 A1 * | 8/2008 | Bechtolsheim | H05K 7/20727 |
| | | | 361/695 |
| 2008/0239666 A1 * | 10/2008 | Heller | H05K 7/20581 |
| | | | 361/695 |
| 2009/0034187 A1 | 2/2009 | Coles et al. | |
| 2009/0207880 A1 * | 8/2009 | Ahladas | G01K 13/00 |
| | | | 374/141 |
| 2010/0092625 A1 | 4/2010 | Finch et al. | |
| 2010/0102636 A1 * | 4/2010 | Tracy | H02J 9/062 |
| | | | 307/80 |
| 2010/0164427 A1 | 7/2010 | Dishman et al. | |
| 2011/0107332 A1 * | 5/2011 | Bash | G06F 1/206 |
| | | | 718/1 |
| 2017/0300091 A1 * | 10/2017 | Elwany | H05K 7/20736 |

FOREIGN PATENT DOCUMENTS

| | | | |
|---|---|---|---|
| CN | 201260293 Y | | 6/2009 |
| CN | 101847940 A | | 9/2010 |
| CN | 201699443 U | | 1/2011 |
| CN | 102052338 A | * | 5/2011 |
| CN | 102217432 A | | 10/2011 |
| CN | 202103439 U | | 1/2012 |
| CN | 102458084 A | | 5/2012 |
| CN | 202468388 U | | 10/2012 |
| EP | 1 566 086 A2 | | 8/2005 |
| GB | 2478779 A | | 9/2011 |
| JP | 2003-174274 A | | 6/2003 |
| JP | 2003-193994 A | | 7/2003 |
| JP | 2008-018497 A | | 1/2008 |
| WO | WO 2004/049773 | | 6/2004 |
| WO | WO 2014/082229 A1 | | 6/2014 |

OTHER PUBLICATIONS

European Search Report Corresponding to European Application No. 12 88 9342; dated Jun. 23, 2016; 13 Pages.
International Search Report Corresponding to International Application No. PCT/CN2012/085468; dated Sep. 5, 2013; 4 Pages.
International Preliminary Report Corresponding to International Application No. PCT/CN2012/085468; dated Jun. 2, 2015; 5 Pages.
Eaton Corporation, Airflow Management Solutions, Data Center Products, 16 Pages, 2011.

* cited by examiner

EQUIPMENT ENCLOSURE FAN CONTROL SYSTEMS AND METHODS

RELATED APPLICATIONS

The present application is a 35 U.S.C. § 371 national phase application of PCT International Application No. PCT/CN2012/085468, having an international filing date of Nov. 28, 2012. The disclosure is incorporated herein by reference in its entirety. The above PCT International Application was published in the Chinese language as International Publication No. WO 2014/082229.

BACKGROUND

The inventive subject matter relates to electronic systems and, more particularly, to cooling systems and methods for electronic systems.

In data centers, telecommunications centers and the like, such equipment is typically mounted in standardized enclosures (e.g., "racks") that may be arranged in rows. Such enclosures may have slots configured to be loaded with modular components, such as servers, routers, hubs and the like, that perform various computing and communications functions. Because electronic equipment may generate significant amounts of heat, cooling systems are often required to prevent equipment malfunction or failure. The equipment and/or the enclosures may be equipped with fans or other air moving devices to provide such cooling. Additional cooling may be provided by duct systems that evacuate heated air from racks using fans in conjunction with various types of exhaust ductwork coupled to the racks. Various cooling system arrangements are described, for example, in a brochure entitled *Airflow Management Solutions*, published by Eaton Corporation (2011).

Rack mounted uninterruptible power supply (UPS) systems are commonly used in data center applications. Such systems may include multiple power converter modules mounted in one or more enclosures. The power converter modules may include integral cooling fans that, for example, draw air into the module and across heat-generating components and exhaust heated air through, for example, a back wall of the module. There is an ongoing need for improved cooling to enable increased power density, reduction in footprint and increased implementation flexibility of these UPS systems.

SUMMARY

Some embodiments of the inventive subject matter provide an uninterruptible power supply (UPS) system including an enclosure and a plurality of power converter modules positioned in the enclosure, each power conversion module including a power converter circuit, a module controller circuit configured to control the power converter circuit and at least one module fan controlled by the module controller circuit. The system further includes a system controller positioned in the enclosure and configured to communicate with the module controller circuits over a communications bus, and at least one exhaust fan configured to exhaust air from the enclosure and controlled by the system controller. The system controller is configured to control the at least one exhaust fan responsive to information received from the module controller circuits. The system controller may also be configured to control static switches and other UPS system components.

In some embodiments, the power converter modules may be configured to generate module temperature information. The module controller circuits may be configured to control speeds of the module fans responsive to the module temperature information. The module controller circuits may be configured to communicate the module temperature information to the system controller and the system controller may be configured to control a speed of the at least one exhaust fan responsive to the module temperature information. The module temperature information may include ambient intake air temperature information and/or heat sink temperature information.

In some embodiments, the power converter modules may be configured to generate module load information and the module controller circuits may be configured to control speeds of the module fans responsive to the module load information. The module controller circuits may be configured to communicate the module load information to the system controller and the system controller may be configured to control a speed of the at least one exhaust fan responsive to the module load information.

In further embodiments, the power converter modules may be configured to generate module status information and the module controller circuits may be configured to control speeds of the module fans responsive to the module status information. The module controller circuits may be configured to communicate the module status information to the system controller and the system controller may be configured to control a speed of the at least one exhaust fan responsive to the module status information. The module status information may include power converter circuit status information and/or module fan status information. The module fan status information may include module fan failure information.

The UPS system may further include at least one sensor positioned in the enclosure apart from the power converter modules. The system controller may be further configured to control the at least one exhaust fan responsive to the at least one sensor. The at least one sensor may be configured, for example, to sense a temperature and/or a load.

Some embodiments of the inventive subject matter provide a system including a communications circuit configured to receive module status information, module temperature information and/or module load information via a communications bus from a plurality of power converter modules mounted in a common enclosure. The system further includes a fan control circuit configured to control at least one exhaust fan that exhausts air from the enclosure responsive to the module status information, module temperature information and/or module load information received from the power converter modules. The fan control circuit may be configured to vary a speed of the at least one exhaust fan responsive to the module status information, module temperature information and/or module load information received from the power converter modules. The module temperature information may include ambient air intake temperature information and/or power converter heat sink temperature information. The module status information may include power converter circuit status information and/or module fan status information, such as module fan failure information.

The system may further include the enclosure, and the communications circuit and the control circuit may be positioned in the enclosure. The system may also include the at least one exhaust fan.

Still further embodiments provide methods of operating a UPS system including a plurality of power converter modules mounted in a common enclosure. The methods include respective ones of the power converter modules independently controlling respective cooling fans thereof responsive to temperature and/or load information for the respective power converter modules and a system controller of the UPS system receiving module status information, module temperature information and/or module load information from the power converter modules and responsively controlling at least one exhaust fan that exhausts air from the enclosure.

DETAILED DESCRIPTION OF EXEMPLARY EMBODIMENTS

Figure 1:
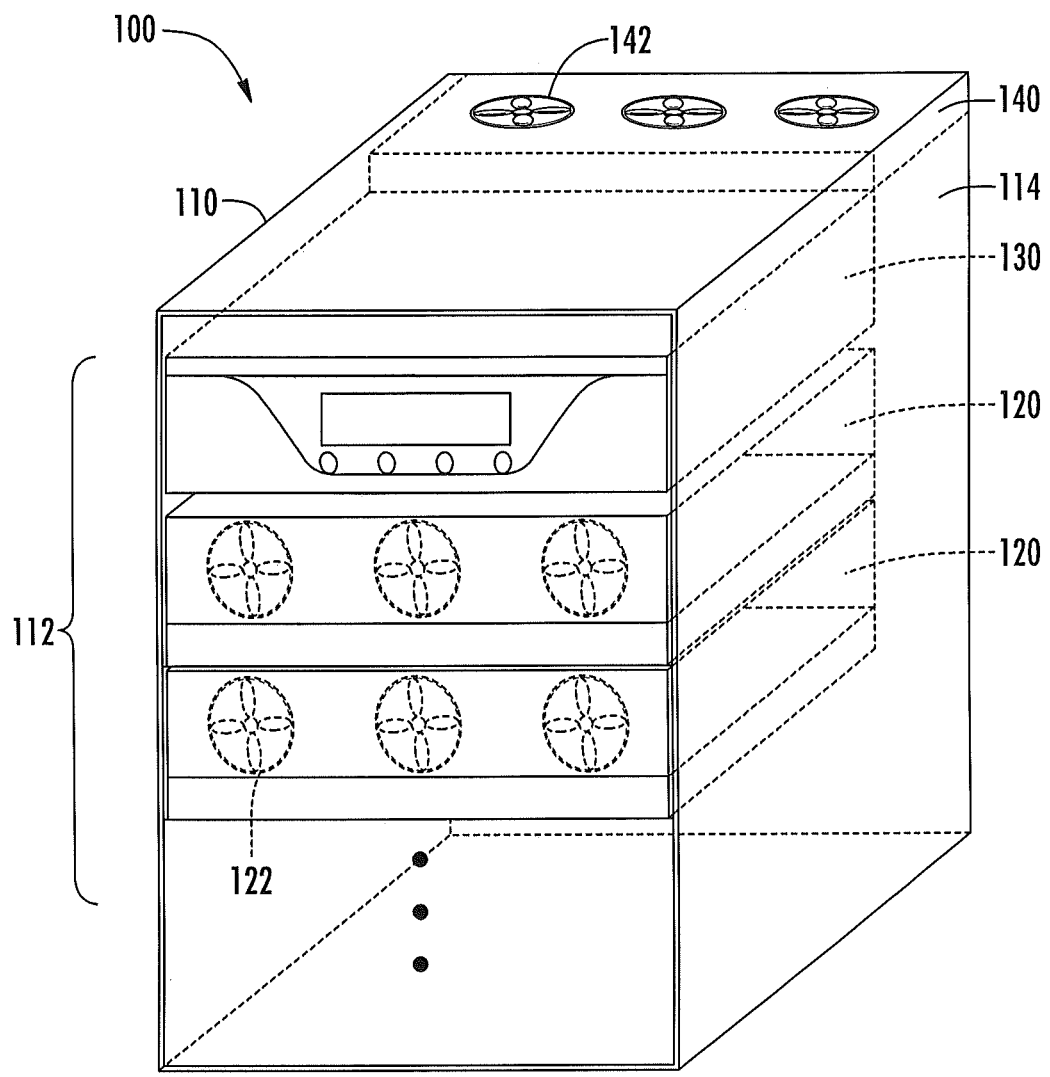
FIG. 1 is a perspective view of a UPS system according some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 2:
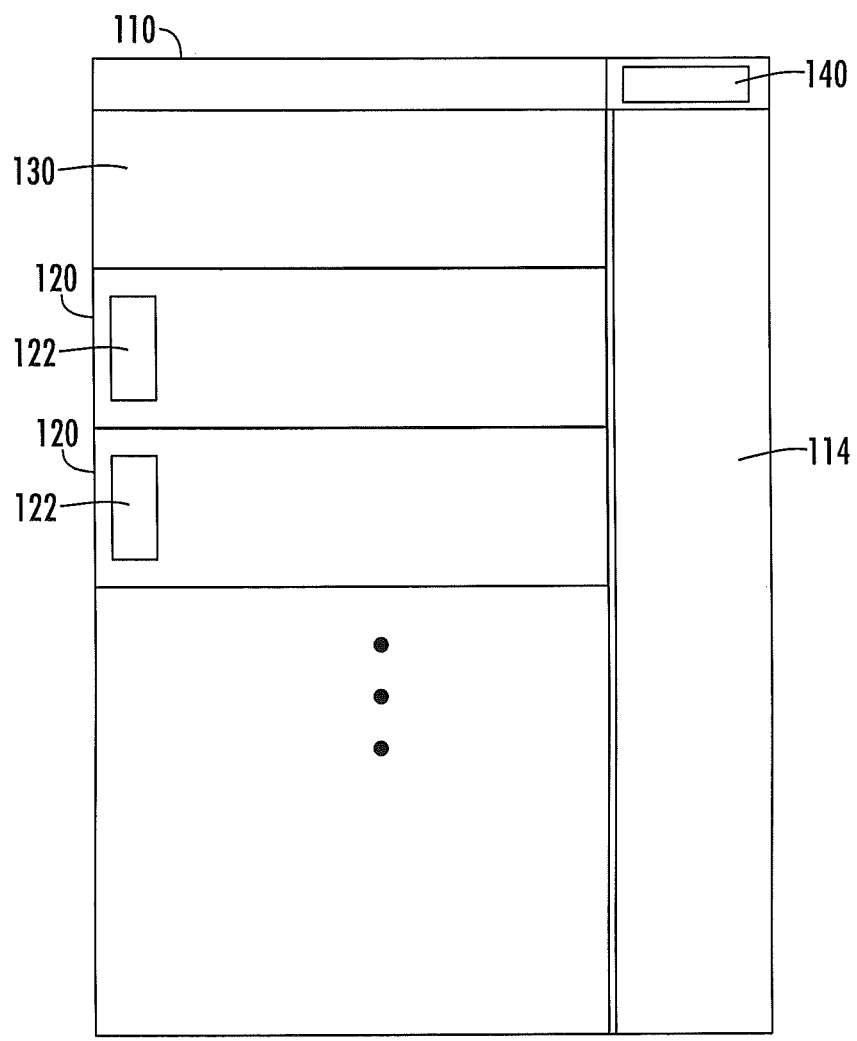
FIG. 2 is a side view of the UPS system of FIG. 1.

FIGS. 1 and 2 are perspective and side views, respectively, of a UPS system 100 according to some embodiments. The UPS system 100 includes a rack or cabinet type enclosure 110. The enclosure 110 is configured to receive and support a plurality of equipment modules in predefined slots 112. As shown, the modules may include a plurality of power converter modules 120 and a system controller 130.

The power converter modules 120 may include one or more power conversion circuits configured to provide UPS operation, such as one or more on-line UPS circuits including a cascaded combination of rectifier and inverter circuits joined by intermediate DC buses. As further illustrated, each power converter module 120 includes one or more module fan systems 122, which are configured to draw air into the module 120 and to exhaust air heated by components of the module 120 out of the rear of the module and into a plenum 114. It will be appreciated that the module fan systems 122 may vary in number and placement within the modules 120, and may include, for example, electric motor driven fans and driver electronics (e.g., motor drivers) that control operation of the fans. The power converter modules 120 may further include control circuitry (e.g., one or more microprocessors, microcontrollers, etc.) configured to control the power conversion circuitry, the module fan systems 122 and other components of the modules 120, and to communicate with the system control module 130. The system control module 130 may include data processing and communications circuitry configured to support control and monitoring of the power converter modules 130 and other systems mounted in the enclosure 110. The system control module 130 may also include module fan systems similar to the module fan systems 122 of the power converter modules 120.

As further illustrated, the UPS system 100 also includes an exhaust fan system 140 generally configured to evacuate heated air exhausted into the plenum 114 by the power converter modules 120 and/or the system controller module 130. The exhaust fan system 140 may include one or more fans positioned in any of a variety of different ways, for example, within the enclosure 110 and/or in ductwork coupled to the enclosure 110. As shown, the exhaust fan system 140 is mounted in the enclosure 110, but it will be appreciate that, in some embodiments, the exhaust fan system 140 may be positioned exterior to the enclosure 110, such as in ductwork coupled to the enclosure 110. As discussed in detail below, in some embodiments, the exhaust fan system 140 may be controlled by the system control module 130 responsive to information related to operation of the power converter modules 120, such as power converter status information, module fan status information, and the like.

Figure 3:
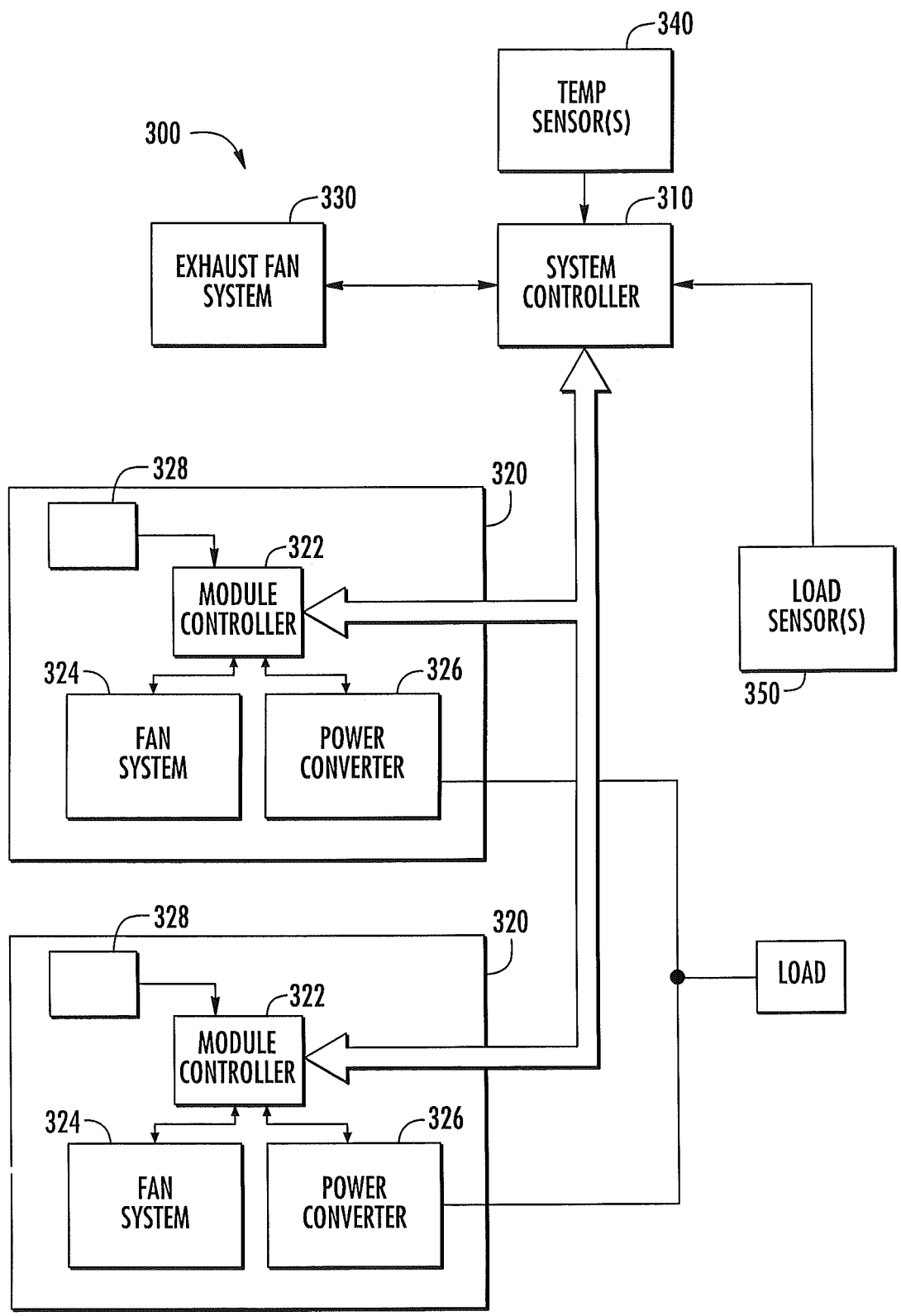
FIG. 3 is a schematic diagram of a UPS system with a fan control subsystem according to some embodiments.

FIG. 3 is a schematic diagram illustrating apparatus and operations for fan control according to some embodiments. A UPS system 300 includes a plurality of power converter modules 320. The power converter modules 320 may include respective enclosures configured to be mounted in a rack or similar larger enclosure, such as the enclosure 110 described above with reference to FIGS. 1 and 2. Each of the power converter modules 320 includes a power converter circuit 326. The power converter circuit 326 may include, for example, a rectifier circuit and an inverter circuit coupled by a DC buses. Components of the power converter circuits 326 may include power semiconductor devices (e.g., IGBTs, power MOSFETs and the like), along with driver circuitry for the power semiconductor devices and associated components, such as heat sinks, temperature sensors, current sensors, voltage sensors, and the like. Inputs and/or outputs of the power converter circuits 326 of the power converter modules 322 may be configured to be paralleled Each power converter circuit 326 is controlled by a module controller circuit 322, which may include, for example, a microcontroller, microprocessor and/or digital signal processor (DSP), and associated peripheral circuitry configured to communicate with the power converter circuit 326 to control the drive circuitry thereof. The module controller circuit 322 may receive signals generated by the power converter circuit 326, such as signals indicating operational status, loading and/or temperature of converter components, such as temperature of heat sinks that are used to cool power semiconductor devices in the power converter circuit 326.

Each of the power converter modules 320 further includes a fan system 324, which may be configured to provide cooling air flow for the power converter circuit 326 and other components of the power converter module 320. The fan system 324 may include one or more electric motor driven fans, along with driver circuitry (e.g., linear or pulse-width modulated driver circuits) for driving the one or more fans at variable speeds. The fan system 324 may receive speed command signals and other operational control signals from the module controller circuit 322 and may provide signals, such as signals indicating status (e.g., failure) of the one or more fans and/or driver circuitry, to the module controller circuit 322. Each power converter module 326 may further include additional sensors 328, such as sensors that sense temperature of ambient air taken in by the fan system 324 and/or other cooling-related parameters, such as air pressure and/or flow rate, that communicate with the module controller circuit 322.

As further illustrated, the module controller circuits 322 of the power converter modules 320 are configured to communicate with a system controller 310 via a digital communications bus 315. In various embodiments, the system controller 310 may be, for example, a separate module mounted in the same enclosure as the power converter modules 320, circuitry otherwise integrated within the enclosure and/or circuitry located outside of the enclosure and electrically coupled to components within the enclosure. The system controller 310 includes a communications circuit 312 for communicating with the power converter modules 320 via the communications bus 315. The system controller 310 may also include control circuitry (e.g., a microprocessor or microcontroller) that may perform supervisory functions, such as monitoring operations of the power converter modules 320, controlling activation, deactivation and/or operating characteristics of the power converter modules 320, and control of other UPS system components, such as a static bypass switch and/or contactors or other switching devices used to couple the power converter module 320 to power sources and/or loads. The system controller 310 may further include additional communications circuitry that performs external communications functions for the UPS system 300, such as Ethernet or other communications interface circuitry that supports communications with supervisory equipment that coordinates operation of the UPS system 300 with other equipment in an application environment, such as in a data center. Such interface circuitry may, for example, support Web-based or other access to the system 300.

The system controller 310 further includes a fan control circuit 312 operatively coupled to an exhaust fan system 330 configured to exhaust heated air passing out of the power converter modules and into the enclosure holding the power converter modules 320 in, for example, an arrangement such as that described above with reference to FIGS. 1 and 2. The exhaust fan system 330 may include one or more electric motor driven fans, along with driver circuitry (e.g., linear or pulse-width modulated driver circuits) for driving the one or more fans at variable speeds. The exhaust fan system 330 may receive analog and/or digital speed command signals and other operational control signals from the fan control circuit 314 and may provide signals, such as signals indicating status (e.g., failure) of the one or more fans and/or driver circuitry, to the fan control circuit 314. The UPS system 300 may further include additional system-level sensors that are interfaced to the system controller 310, such as one or more temperature sensors 340 that sense temperature of intake and/or exhaust air for the exhaust fan system 330 and/or temperatures of other parts of the enclosure environment, and load sensors 350 that sense loading of equipment served by the power converter modules 320.

According to some embodiments, the module controller circuits 322 in each of the power converter modules 322 may independently control their respective associated fan systems 324 based on load and thermal information generated by the respective power converter modules 320. For example, a module controller circuit 322 may control the speed of the associated module fan system 324 using heat sink temperature, ambient air temperature and loading (e.g., current level) information received from the module-level sensors 328 and the power converter circuit 326.

The system controller 310 may control the exhaust fan system 330 based on information provided by the system level temperature and load sensors 350, as well as on status, load and temperature information obtained from the module controller circuits 322. For example, the system controller 310 may use this status, thermal and load information to minimize exhaust fan speed to reduce audible noise and/or power consumption while maintaining temperatures for the power modules 320 and other equipment in the system 300 within acceptable limits that provide a desired level of reliability. The system controller 310 may adaptively control the exhaust fan system 330 responsive to changes in status of the power converter modules 320 using such information. For example, the system controller 310 may increase exhaust fan speed in response to receiving information from the modules 320 that indicates increased module loading, increased heat sink or ambient air temperature and/or failure of a module fan system 324.

Figure 4:
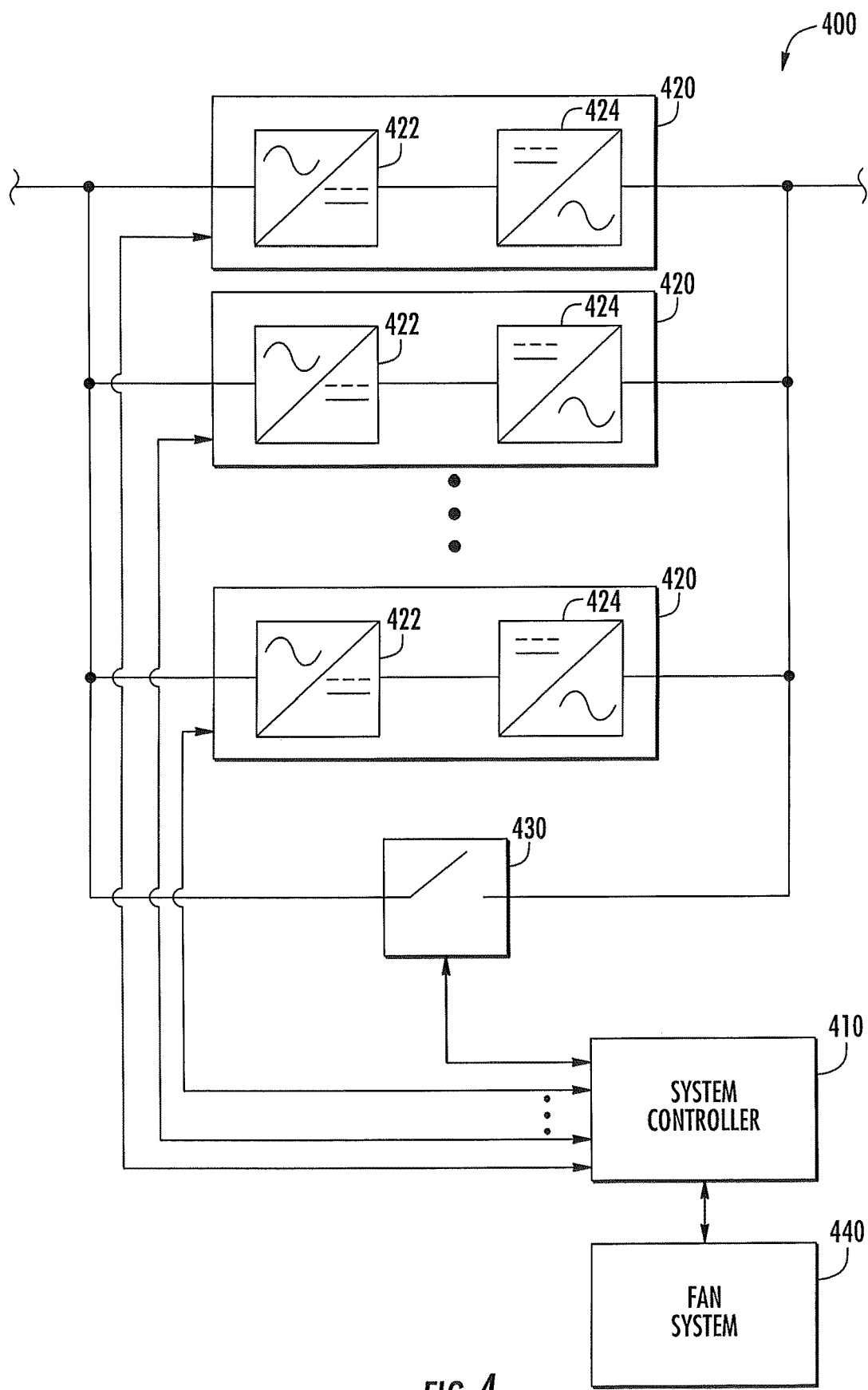
FIG. 4 is a schematic diagram of UPS system with a fan control subsystem according to further embodiments.

According to some embodiments, a system controller along the lines described above may also control an inlet fan system and/or an exhaust fan system based on operational modes of power converter modules. Referring to FIG. 4, a UPS system 400 includes a plurality of power converter modules 420. As shown, each module 420 has an on-line UPS architecture including a rectifier circuit 422 coupled to an inverter circuit 424. The UPS system 400 may also include at least one bypass switch 430 configured to bypass the rectifier and inverter circuits 422, 424. It will be understood that the at least one bypass switch 430 may be separate from the power converter modules 420 or may be incorporated as multiple switches, respective ones of which are included in or associated with respective ones of the modules 420 in a distributed bypass arrangement.

The at least one bypass switch 430 may be closed to bypass the rectifier and inverter circuits 422, 424 in various operational modes. For example, if one or more of the rectifier circuits 422 or inverter circuits 422 experiences a failure, the system controller 410 may close the at least one bypass switch 430 and deactivate the converter circuits in the modules 420, such that the load is served via the at least on bypass switch 430. If the system controller 410 detects that an AC source applied to the power converter modules 420 meets certain quality criteria (e.g., voltage, frequency, harmonic content, etc.), the system controller may also close the at least one bypass switch 430 and place the converter circuitry of the power converter modules 420 in a standby state to transition the system 400 to a "high efficiency" mode in which power is delivered via the at least one bypass switch 430 to reduce converter-related losses. In response to detection either of these modes, the system controller 410 may, for example, reduce the speed of the exhaust fan system 440 and/or fan systems of the power converter modules 420 due to an anticipated reduced thermal output of the modules 420, thus potentially reducing power consumption by the exhaust fan system 440 and/or the module fan systems and augmenting power savings obtained by bypass the converter circuitry. The adaptation of the exhaust fan speed may also reduce ambient noise level in the data center or other environment in which the system is operating.

It will be appreciated that the above-described adaptive fan control operations are provided as examples, and that other control regimes fall within the scope of the inventive subject matter.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An uninterruptible power supply (UPS) system, comprising:
   an enclosure;
   at least one exhaust fan configured to exhaust air from the enclosure;
   a plurality of power converter modules positioned in the enclosure, each power converter module of the plurality of power converter modules comprising a power converter circuit, at least one module fan, and a module controller circuit configured to control the power converter circuit and the at least one module fan and to generate module fan status information indicating a status of the at least one module fan; and
   a system controller positioned in the enclosure and configured to receive the module fan status information from the module controller circuits over a communications bus and to control the at least one exhaust fan responsive to the module fan status information received from the module controller circuits.

2. The system of claim 1, wherein the power converter modules are configured to generate module temperature information and wherein the module controller circuits are configured to control the speeds of respective ones of the module fans responsive to the module temperature information.

3. The system of claim 2, wherein the module controller circuits are configured to communicate the module temperature information to the system controller and wherein the system controller is configured to control a speed of the at least one exhaust fan responsive to the module temperature information.

4. The system of claim 3, wherein the module temperature information comprises ambient intake air temperature information and/or heat sink temperature information.

5. The system of claim 1, wherein the power converter modules are configured to generate module load information and wherein the module controller circuits are configured to control the speeds of respective ones of the module fans responsive to the module load information.

6. The system of claim 5, wherein the module controller circuits are configured to communicate the module load information to the system controller and wherein the system controller is configured to control a speed of the at least one exhaust fan responsive to the module load information.

7. The system of claim 1, wherein the power converter modules are configured to generate power converter status information and wherein the module controller circuits are configured to control speeds of the module fans responsive to the power converter status information.

8. The system of claim 7, wherein the module controller circuits are configured to communicate the power converter status information to the system controller and wherein the system controller is configured to control a speed of the at least one exhaust fan responsive to the power converter status information.

9. The system of claim 1, wherein the module fan status information comprises module fan failure information.

10. The system of claim 1, further comprising at least one sensor positioned in the enclosure apart from the power converter modules, and wherein the system controller is further configured to control the at least one exhaust fan responsive to the at least one sensor.

11. The system of claim 10, wherein the at least one sensor is configured to sense a temperature and/or a load.

* * * * *